United States Patent [19]

Koluvek

[11] Patent Number: 5,469,070
[45] Date of Patent: Nov. 21, 1995

[54] CIRCUIT FOR MEASURING SOURCE RESISTANCE OF A SENSOR

[75] Inventor: Roland H. Koluvek, Orange, Calif.

[73] Assignee: Rosemount Analytical Inc., La Habra, Calif.

[21] Appl. No.: 962,133

[22] Filed: Oct. 16, 1992

[51] Int. Cl.⁶ ............................................. G01N 27/02
[52] U.S. Cl. ..................... 324/713; 324/425; 204/412
[58] Field of Search .................................. 324/693, 713, 324/425, 438, 71.1; 204/412, 401, 406

[56] References Cited

U.S. PATENT DOCUMENTS

| | | | |
|---|---|---|---|
| 2,852,738 | 9/1958 | Sherman | 324/54 |
| 3,360,719 | 12/1967 | Saito et al. | 324/31 |
| 3,661,748 | 5/1971 | Blackmer | 204/195 |
| 3,718,568 | 2/1973 | Neuwelt | 204/195 |
| 3,862,895 | 1/1975 | King et al. | 204/195 |
| 4,094,186 | 6/1978 | Wessel | 73/1 |
| 4,167,163 | 9/1979 | Möder | 123/119 |
| 4,189,367 | 2/1980 | Connery et al. | 204/195 |
| 4,218,746 | 8/1980 | Koshiishi | 364/571 |
| 4,443,763 | 4/1984 | Marsoner | 324/439 |
| 4,468,608 | 8/1984 | Rolfe | 324/51 |
| 4,686,011 | 8/1987 | Jäckle | 204/1 |
| 4,777,444 | 10/1988 | Beijk et al. | 324/439 |
| 4,822,456 | 4/1989 | Bryan | 204/1 |
| 4,829,253 | 5/1989 | Koluvek | 324/438 |
| 5,059,908 | 10/1991 | Mina | 324/444 |

FOREIGN PATENT DOCUMENTS

3239572A1 of 0000 Germany.

*Primary Examiner*—Maura K. Regan
*Attorney, Agent, or Firm*—Westman, Champlin & Kelly

[57] ABSTRACT

A method and apparatus are disclosed for measuring a resistance of a sensor. The apparatus injects a first test current into the sensor and then measures a substantially stable first voltage level across the sensor when the first test current is present. The apparatus then injects a second test current into the sensor, the second test current being substantially equal to but opposite in polarity to the first test current. A substantially stable second voltage level across the sensor is measured when the second test signal is present. Using the first measured voltage level and the second measured voltage level, the apparatus calculates the resistance of the sensor.

24 Claims, 7 Drawing Sheets

CIRCUIT FOR MEASURING SOURCE RESISTANCE OF A SENSOR

BACKGROUND OF THE INVENTION

This invention relates to a circuit for measuring a source resistance of a sensor. In particular, this invention provides for measurement of the source resistance of the sensor by applying a known test current to the sensor to obtain substantially stable voltages, and measuring the resulting voltages to calculate the source resistance.

Continuous measurement of electrodes in a solution is known throughout the art. For example, Blackmer in U.S. Pat. No. 3,661,748 discloses a device in which an ac signal is applied via an electrode to the conductive fluid in which the electrode system is disposed. An ac signal detector is connected to the dc circuitry to measure the ac current flow. A threshold circuit responsive to the output of the ac signal detector indicates fault in the electrochemical sensor system when the output is of a predetermined magnitude. The system measures a change in resistance of the electrode membrane by a phase detector using the ac signal source as a phase reference. A resistance threshold is provided such that an alarm will sound when the threshold is exceeded.

Connery et al., U.S. Pat. No. 4,189,367 disclose another system for testing electrodes. In Connery et al., the electrodes comprise a glass membrane pH electrode and a reference electrode. The membrane is tested for damage during periodic testing periods by applying a test current through the electrodes and measuring the corresponding changing voltages produced between the electrodes. A reverse current of the same magnitude and duration is then applied through the electrode system to discharge capacitance. The test system does not test the reference electrode and pH electrode separately.

While it is important to monitor sensor electrodes while the sensing system is in use, it is desirable to do this quickly, with low power consumption, and without corrupting the data signal. Some prior art systems are very slow because capacitors are used to measure resistance. Very large resistances have large RC time constants which makes measurement slow. Many prior art systems are not properly isolated or shielded, thus allowing stray capacitances to effect the values being measured.

Previous prior art systems have also disclosed that bulk resistances of a membrane, such as a glass membrane, can be measured by passing a unidirectional test current through the glass and measuring the resultant voltage drop to calculate the resistance. A unidirectional current would not be acceptable in a continuously monitoring system such as the present invention because the electrode would be polarized and would produce erroneous results.

SUMMARY OF THE INVENTION

The present invention provides a fast acting apparatus to measure the resistance of a sensor in a substance without substantially upsetting the data due to sampling by applying a known test current to the sensor. The sensor can have virtually any input resistance.

Generally, the apparatus injects a first test current into the sensor and then measures a substantially stable first voltage level across the sensor when the first test current is present. The apparatus then injects a second test current into the sensor, the second test current being substantially equal to but opposite in polarity to the first test current. A substantially stable second voltage level across the sensor is measured when the second test signal is present. Using the first measured voltage level and the second measured voltage level, the apparatus calculates the resistance of the sensor.

In a preferred embodiment, an oscillating signal is generated to drive the apparatus of the present invention. Portions of the oscillating signal are then made available at inputs of a differential amplifier. The differential amplifier provides the positive test current and negative test current repetitively to the sensor.

The differential amplifier is connected to the sensor by means of coaxial cable. The coaxial cable is boot-strapped to reduce the effect of input capacitance, and to improve the speed of the apparatus. The result of the present invention is that the sensor resistance can be measured simultaneously and on a continuous basis without upsetting readings corresponding to the sensor source voltage.

DETAILED DESCRIPTION OF THE PREFERRED EMBODIMENTS

The present invention provides an apparatus to measure the source resistance of a sensor by injecting a known test current. Source resistance is the internal resistance of the sensor along with any external conditions such as coating or cracking of the sensor, which together may change the total resistance of the sensor as measured from a monitoring device connected to the sensor.

These sensors further produce a source voltage that is received by the monitoring device. The source voltage is a signal representing a parameter or condition that the sensor is measuring. It should be understood, that the present invention will be described with reference to a pH sensor but the present invention is applicable to other sensors with a broad range of source resistances such as selective ion sensors, oxygen sensors and the like.

Source resistance can be measured by injecting a known test current into a test electrode. The resultant change in voltage divided by the test current is equal to the source resistance. In the present invention, a test current is to be injected into the electrode alternately in each polarity with equal magnitude and time duration. By injecting current in this manner, the total average charge to the electrode will be zero for a complete test cycle. For a pH electrode, application of a reverse current discharges capacitance in the electrode and prevents unidirectional ionic migration in the electrode glass. The resultant voltages caused by the switched test current will be stored and then sampled. By taking the sum and difference of the resultant voltages, the source voltage and source resistance can be calculated. An alternative way to calculate the resistance and voltage of the sensor is to digitize the resultant voltages with an analog to digital (A/D) converter and have a microprocessor compute the source voltage as well as the source resistance.

Calculating the source resistance allows the user to determine the integrity of the sensor and thus determine the relative accuracy of the sensor system. Sensor systems which have electrodes immersed in solutions, such as pH sensors, may become coated over time. Electrodes that get coated over time slowly increase in resistance. To protect against using a sensor system with over-coated electrodes, the user preselects a maximum allowable resistance into a microprocessor and when that value is sensed by the circuit of the present invention a fault indicator informs the user that replacement, maintenance, and/or recalibration is necessary. In the same way, electrodes may become cracked or broken. The characteristic of a cracked or broken electrode is a sharp decrease in electrode resistance. In this case, the user preselects a minimum value for the electrode resistance into the microprocessor. If, and when this value is detected by the circuit, a fault signal is generated.

Figure 1:
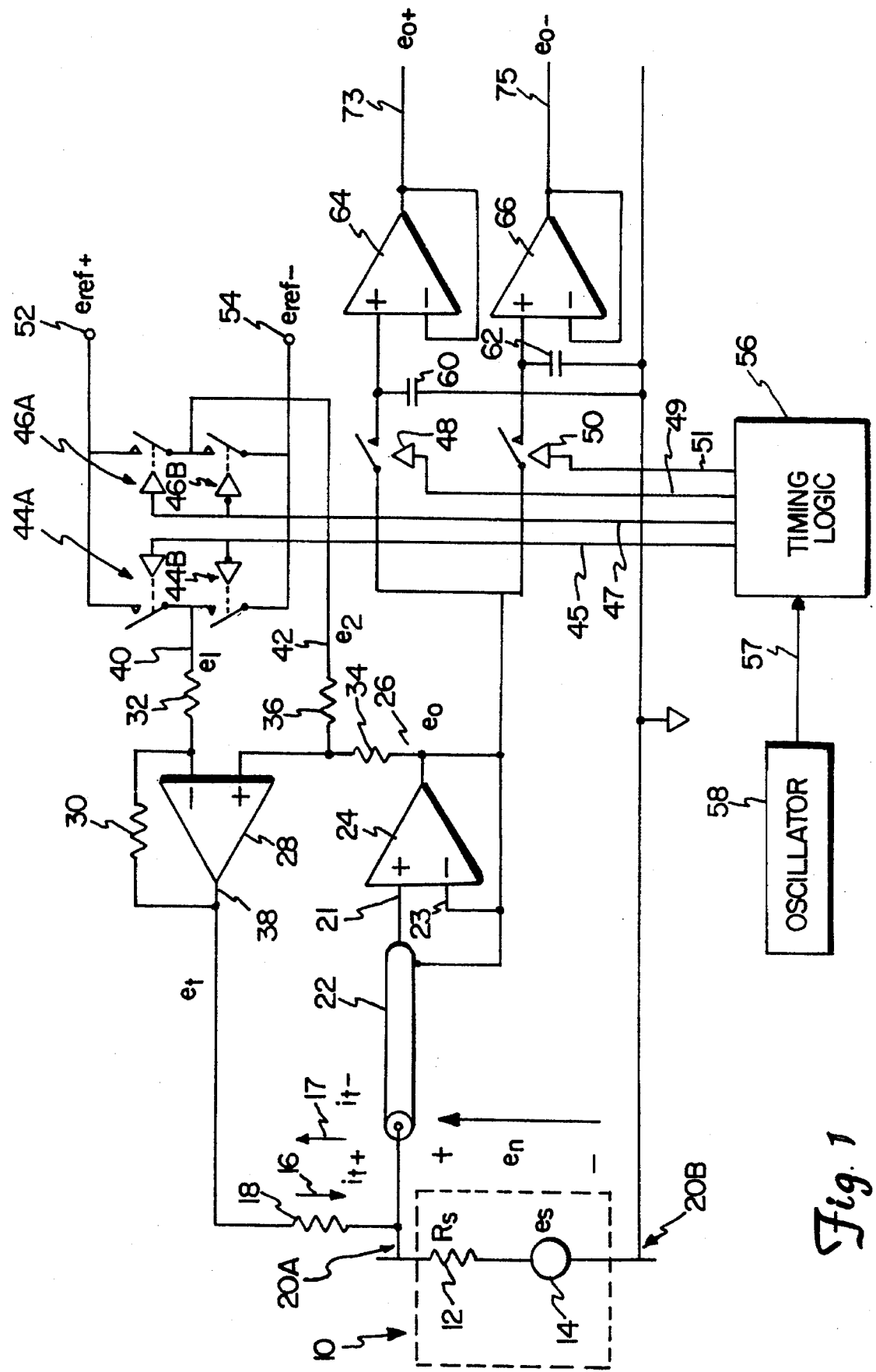
FIG. 1 is a circuit diagram of a measuring apparatus of the present invention.

FIG. 1 illustrates a schematic and block diagram circuit of an input portion of the resistance measuring apparatus of the present invention. A sensor, shown generally at 10, is connected across terminals 20A and 20B, has an source resistance 12 $R_s$ and an source voltage 14 $e_s$. A positive test current $i_{t+}$, represented by arrow 16, and a negative test current $i_{t-}$, represented by arrow 17, are injected through resistor 18 into the sensor 10 at terminal 20A resulting in a corresponding voltage $e_n$ produced across the terminals 20A and 20B. Terminal 20A is connected via a coaxial cable 22 to input 21 of an amplifier 24. The shield of coaxial cable 22 is connected to input 23 of amplifier 24.

Amplifier 24, is a voltage follower amplifier with high resistance input and very low bias current, which means the bias current is much less than the injected current through the sensor 10. For sensors that have high source resistance, an amplifier with very high amplifier resistance would be the best. Since amplifier 24 is a voltage follower amplifier, an output voltage $e_o$ at an output terminal 26 of amplifier 24 is substantially equal to the input voltage at terminal 21.

As illustrated, the coaxial cable 22 is boot-strapped to reduce the effective input capacitance and to improve the speed of the sensor 10. Boot-strapping is done by driving the coaxial shield and surrounding guard straps of cable 22 with the output voltage at terminal 26. Since the voltage at terminal 26 is equal to the voltage at terminal 21, there is no voltage change across the cable 22 and thus, the coaxial capacitance of cable 22 does not inject charge into the input terminal 21.

The voltage at terminal 26 drives a differential amplifier 28 which includes resistors 30, 32, 34 and 36. The resistors 30 and 34 are equal to each other and collectively will be referred to as $R_F$. The resistors 32 and 36 are also equal to each other and collectively will be referred to as $R_N$. It is very important that resistors 30 and 34 are matched to equal each other and that resistors 32 and 36 are also equal to each other since errors in the injected current through resistor 18 would result if each of the above-mentioned resistor pairs were not matched. The differential amplifier 28 produces an output voltage $e_t$ at terminal 38 as a result of input voltages $e_1$ and $e_2$ applied to signal lines 40 and 42, respectively, according to the equation below where the gain of the amplifier 28 is $R_F/R_N$.

$$e_t = \left[ (e_2 - e_1)\frac{R_f}{R_n} \right] + e_o \quad \text{EQUATION (1)}$$

If the voltage $e_1$ on signal line 40 is equal to the voltage $e_2$ on signal line 42, then the output voltage $e_t$ at terminal 38 would be equal to the voltage $e_o$ at terminal 26 and the voltage $e_n$ at terminal 20A. If the voltage $e_t$ is equal to the voltage $e_n$, then there would be no voltage across resistor 18 and therefore no current will be injected into the sensor 10.

Switches 44A, 44B, 46A and 46B control the voltage applied to signal lines 40 and 42. For instance, if switch 44A is closed and switch 44B is open, a positive reference voltage $e_{ref+}$ at terminal 52 is applied to signal line 40. Similarly, if switch 44B is closed and switch 44A is open, a negative reference voltage $e_{ref-}$ at terminal 54 will be applied to signal line 40. Switch 44B is tied to signal line 45 as is switch 44A but switch 44B operates opposite to switch 44A so that switch 44B is always closed when switch 44A is open and vice-versa. Switches 46A and 46B are similar to switches 44A and 44B and are connected to signal line 47 with switch 46B operating opposite to that of switch 46A. Thus, if switch 46A is closed and switch 46B is open, the positive reference voltage $e_{ref+}$ at terminal 52 is applied to signal line 42. Whereas, if switch 46B is closed and switch 46A is open, the negative reference voltage $e_{ref-}$ at terminal 54 is applied to signal line 42.

A timing logic system 56 provides control signals on signal lines 45 and 47 and this activates switches 44A, 44S, 46A and 46B. An oscillator 58 drives the timing logic system 56 with a suitable signal provided on signal line 67. By controlling the switching of switches 44A, 44B, 46A and 46B, the timing logic system 56 generates the injector test currents $i_{t+}$ and $i_{t-}$ as represented by arrows 16 and 17, respectively. For instance, by switching the signal line 42 to the positive reference voltage $e_{ref+}$ at terminal 62 while the signal line 40 is connected to the negative reference voltage $e_{ref-}$ at terminal 54, the positive test current $i_{t+}$ will flow through resistor 18. The value of the positive test current $i_{t+}$ is represented by the following equation.

$$i_{t+} = \frac{(e_{ref+} - e_{ref-})\frac{R_F}{R_N}}{R_{18}} \quad \text{EQUATION (2)}$$

Whereas, switching the signal line 40 to the positive reference $e_{ref+}$ at terminal 52 while the signal line 42 is connected to the negative reference voltage $e_{ref-}$ at terminal 54 generates the negative test current $i_{t-}$ which will flow through resistor 18 in an opposite direction from $i_{t+}$ 16. The value of the negative test current $i_{t-}$ is represented by the following equation.

$$i_{t-} = \frac{(e_{ref-} - e_{ref+})\frac{R_F}{R_N}}{R_{18}} \quad \text{EQUATION (3)}$$

It should be noted that there are other ways to generate the test currents $i_{t+}$ and $i_{t-}$. For example, the signal line 40 could be grounded and a symmetrical oscillating voltage above and below ground could be applied to the signal line 42. Alternatively, the signal line 42 could be grounded and the symmetrical oscillating voltage could be applied to the signal line 40.

The voltage across terminals 20A and 20B when the test current $i_{t+}$ 16 is applied is given by the following equation:

$$e_n = e_s + i_{t+} R_s \quad \text{EQUATION (4)}$$

Likewise, when $i_{t-}$ 17 is applied to the sensor 10 the voltage across terminals 20A and 20B is given by the following equation:

$$e_n = e_s + i_{t-} R_s \qquad \text{EQUATION (5)}$$

The timing logic circuit 56 also controls a sample and hold circuit comprising switches 48 and 50 and capacitors 60 and 62. Signal lines 49 and 51 connect the timing logic circuit 56 to switches 48 and 50, respectively. The capacitors 60 and 62 are used to store the output voltages produced at terminal 26 when the positive test current $i_{t+}$ and the negative test current $i_{t-}$ are generated.

Figure 3:
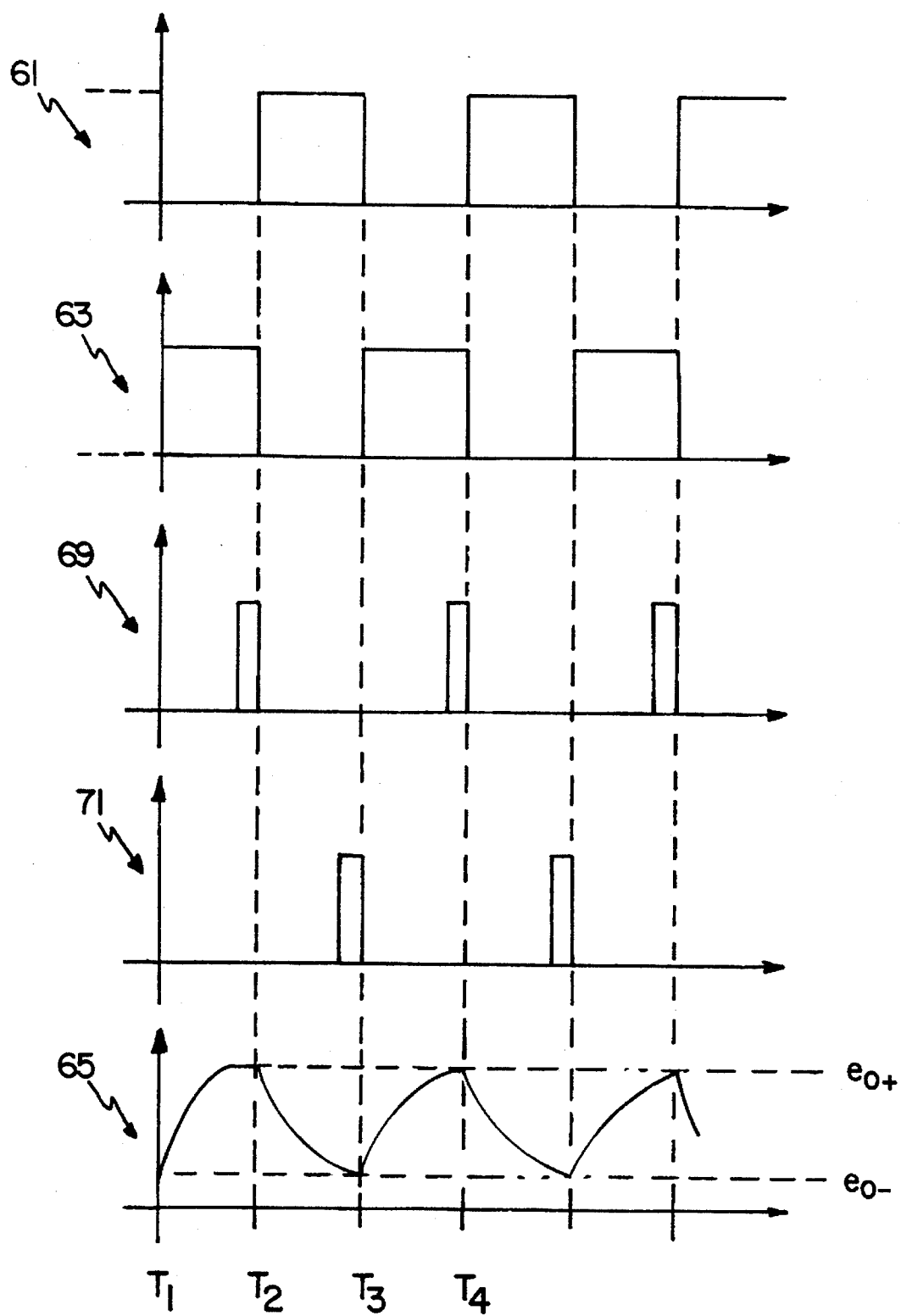
FIG. 3 is a timing diagram showing the on times and off times of voltages at various points of the circuit of FIG. 1.

The timing diagram of FIG. 3 illustrates operation of the circuit of FIG. 1. A timing signal 61 corresponds to the signal generated on signal line 45, while a timing signal 63, opposite in phase to timing signal 61, corresponds to the signal generated on signal line 47. As described above, the signal lines 45 and 47 are used to control operation of the switches 44A, 44B, 46A and 46B in order to generate the positive test current $i_{t+}$ and the negative test current $i_{t-}$. For instance, during a time duration from $T_1$ to $T_2$, the signal 61 applied to the signal line 45 is low, while the signal 63 applied to the signal line 47 is high, which in turn closes switches 44B and 46A and opens switches 44A and 46B. As stated above, this causes a positive test current $i_{t+}$ to flow through resistor 18 thereby producing an increasing output voltage $e_o$ at terminal 26 as represented by signal line 65. The rise time illustrated in signal line 65 is caused by stray distributive capacitance and the internal resistance $R_S$ 12 of the sensor 10 as well as the non-ideal operation of the amplifiers. When the output voltage $e_o$ is substantially stable having reached its peak value, the switch 48 is operated through signal line 49 as represented by a timing signal 69 illustrated in FIG. 3. The corresponding peak output positive voltage $e_{o+}$ is thus stored on capacitor 60.

Similar operation is performed to a peak output negative voltage $e_{o-}$ when the negative test current $i_{t-}$ is generated. Referring to the time duration from $T_2$ to $T_3$, the signal 61 applied to the signal line 45 is high, while the signal 63 applied to the signal line 47 is low, which in turn opens switches 44B and 46B and closes switches 44A and 46B. As stated above, this causes the negative test current $i_{t-}$ to flow through resistor 18 thereby producing a decreasing output voltage $e_o$ at terminal 26 as represented by the signal line 65. When the output voltage $e_o$ is substantially stable having reached its lowest peak value, the switch 50 is operated through signal line 51 as represented by a timing signal 71 illustrated in FIG. 3. The corresponding peak output negative voltage $e_{o-}$ is thus stored on capacitor 62. Preferably, as illustrated in FIG. 3, the above-described sequence continues repetitively throughout operation of the sensor.

Referring back to FIG. 1, amplifiers 64 and 66 receive the values held on capacitors 60 and 62, respectively. The amplifiers 64 and 66 are connected as voltage followers. The amplifier 64 provides a voltage signal on a signal line 73 corresponding to the peak output positive voltage $e_{o+}$, while the amplifier 66 provides a voltage signal on a signal line 75 corresponding to the peak negative voltage $e_{o-}$.

Figure 2:
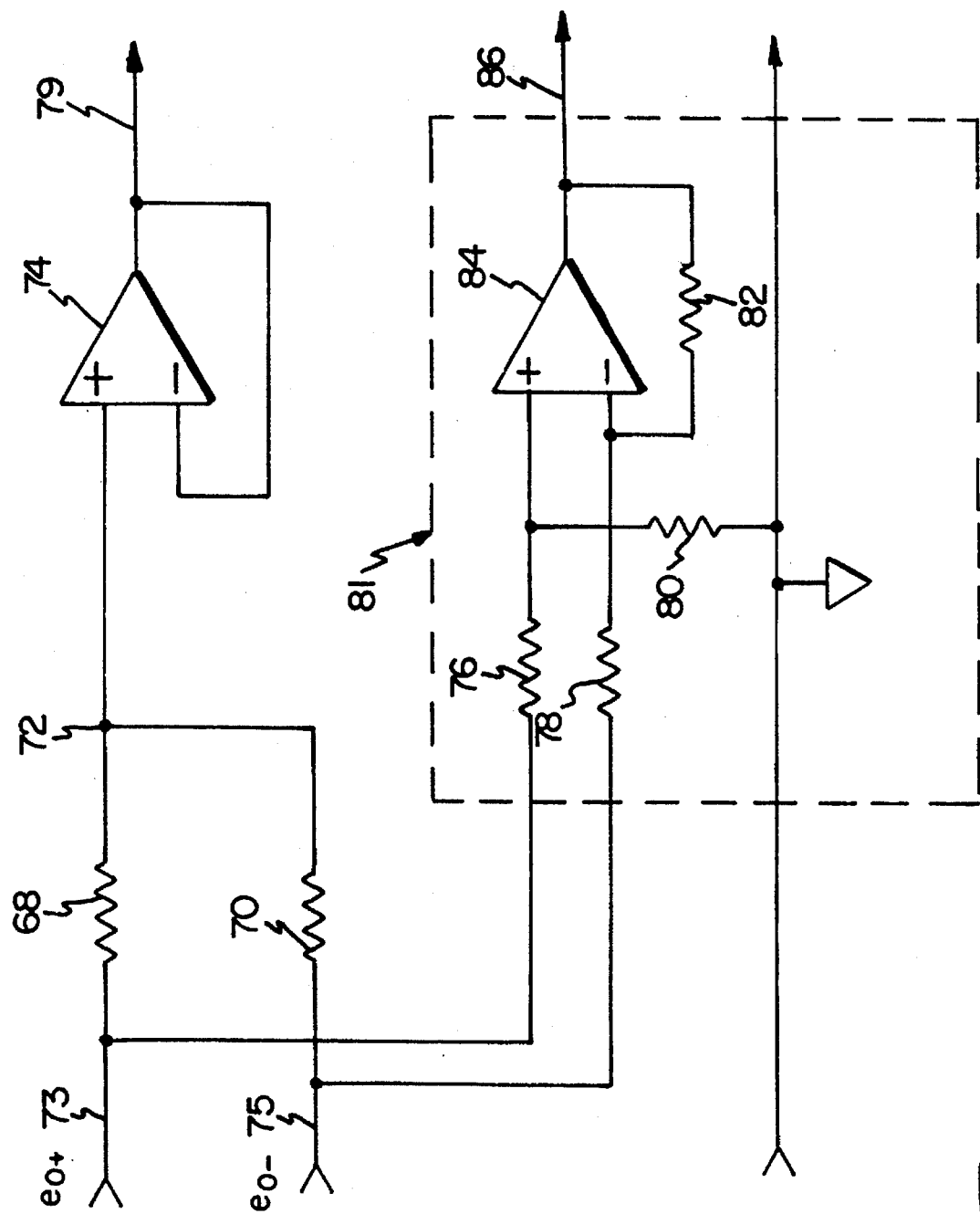
FIG. 2 is a circuit diagram of an analog output portion of the circuit of FIG. 1.

FIG. 2 illustrates a simple circuit connected to the circuit of FIG. 1 that is capable of calculating the source voltage $e_S$ and the source resistance $R_S$. The source voltage $e_S$ is calculated using resistors 68 and 70, and an amplifier 74. As illustrated, the resistor 68 is connected to signal line 73, while the resistor 70 is connected to signal line 75. The resistors 68 and 70 are equal to each other and are connected together at a node 72, which is in turn connected to a positive input of the amplifier 74. The resistors average the voltages present on the signal lines 73 and 75 wherein the voltage at node 72 is equal to $(e_{o+}+e_{o-})/2$. The amplifier 74, being connected as a voltage follower, receives the value provided at node 72 and makes that value available on a signal line 79 for displaying or for use in later calculations.

A differential amplifier circuit 81 also connected to signal lines 73 and 75 is used to calculate the input resistance $R_s$ of sensor 10. The differential amplifier circuit 81 comprises resistors 76, 78, 80 and 82 and an amplifier 84. The resistors 76, 78, 80 and 82 are all equal to each other, which in turn makes differential amplifier 84 have a unity voltage gain. Since the output of a differential amplifier circuit is equal to the difference between the incoming signals multiplied by the gain of the amplifier, and since the gain of the amplifier circuit 81 is unity, an output terminal 86 of amplifier 84 is equal to the difference of the voltages on signal lines 73 and 75, or the quantity $(e_{o+}-e_{o-})$. With the voltage at terminal 86 equal to the quantity $(e_{o+}-e_{o-})$, the source resistance $R_s$ of the sensor 10 can be calculated by dividing by two times the value of the positive test current $i_{t+}$ or the negative test current $i_{t-}$.

Figure 4A:
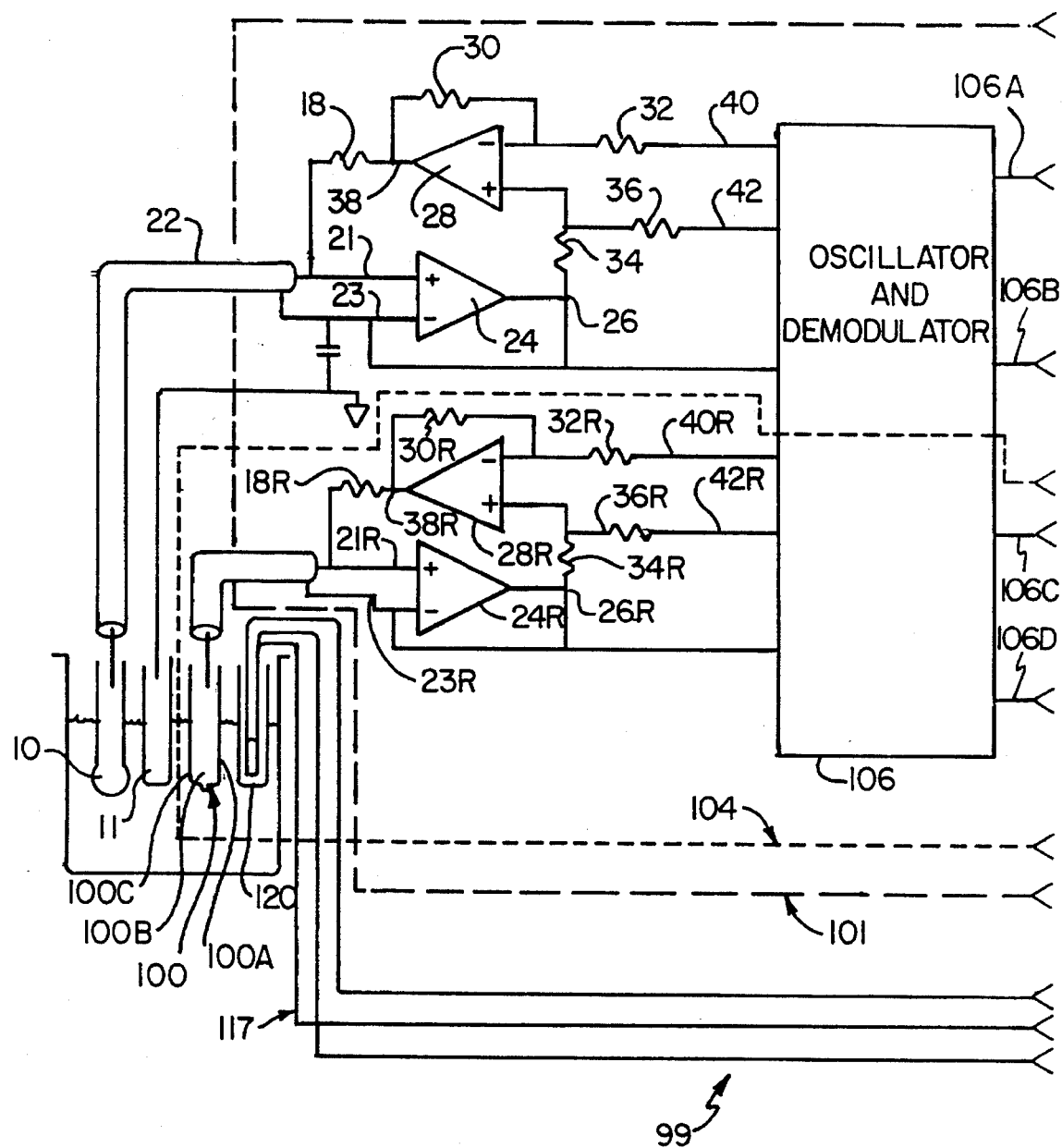
FIGS. 4A and 4B are a schematic and block diagram of a second embodiment of the present invention, and FIGS. 5A and 5B together are a partial detailed circuit diagram of the circuit of FIGS. 4A and 4B.
Figure 4B:
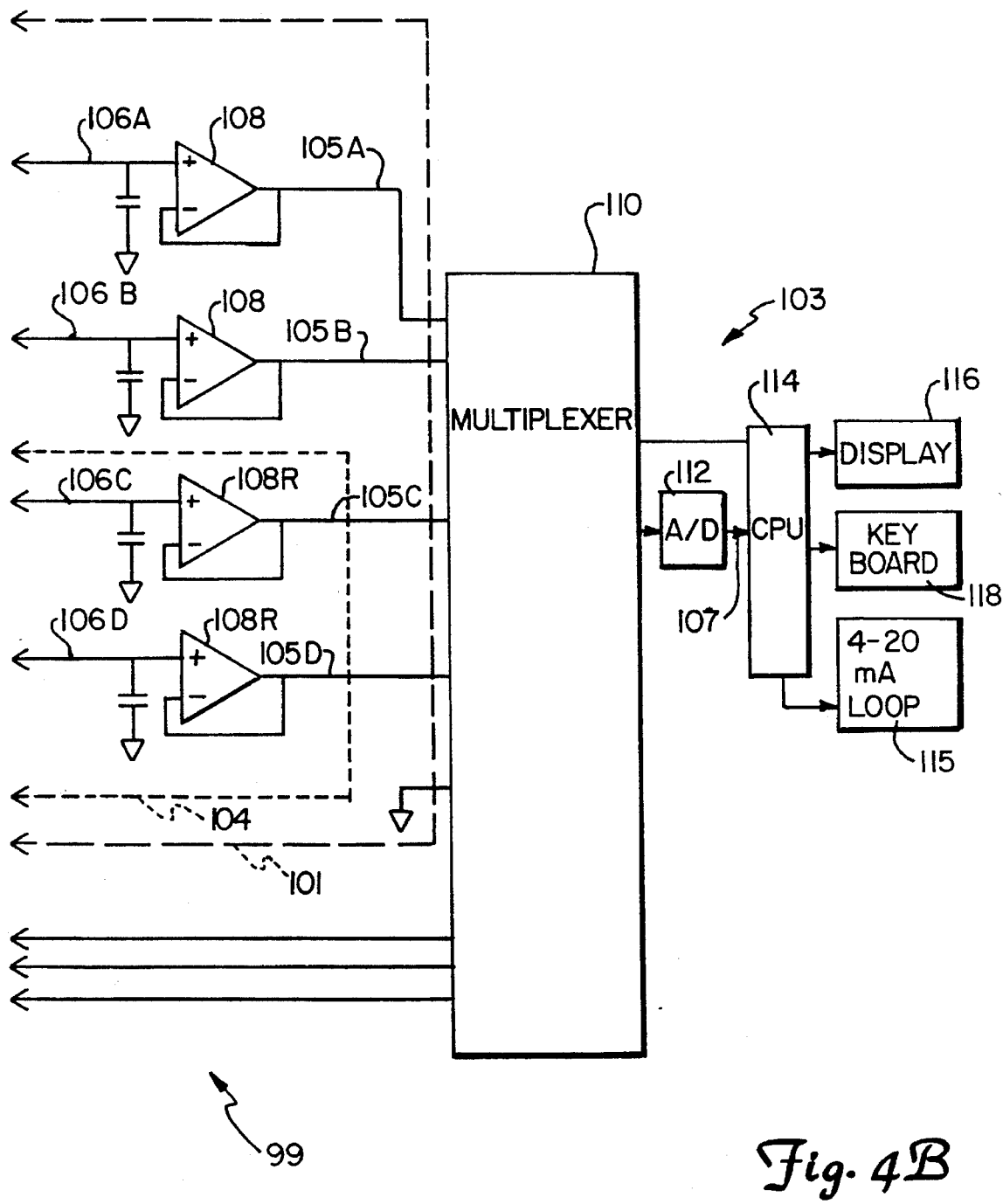

A schematic, block diagram of an alternative preferred embodiment of the present invention is illustrated in FIGS. 4A and 4B. In FIGS. 4A and 4B, like elements from FIGS. 1 and 2 are correspondingly numbered. FIGS. 4A and 4B illustrates a dual channel sensing system 99 having a test current injection and voltage measuring circuit 101 and an output circuit 103.

The dual channel system 99 measures the source resistance and source voltage of each electrode of an ion sensor system comprising a glass pH electrode 10 and a reference electrode 100. It should be noted that the reference electrode can comprise an ion selective electrode such as disclosed in U.S. Pat. No. 3,862,985 issued to King el al herein incorporated by reference. As illustrated in FIG. 4A, this electrode comprises a reservoir 100A filled with a pH buffer solution 100B having a porous junction 100C in contact with the test solution to be tested.

Referring to connection of the circuit 101 to the pH electrode 10, test currents of equal magnitudes and opposite polarity are injected into the pH electrode 10 in the manner described above with the differential amplifier circuit connected to amplifier 28. Reference voltages on the signal lines 40 and 43 are provided from an oscillator and demodulator circuit generally indicated at 106 and described in detail below. As with the circuit illustrated in FIG. 1 and described above, the voltage produced at the terminal 26 of the amplifier 24 corresponds to the signal line 65 in FIG. 3. This output voltage is provided back to the circuit 106.

A reference portion of the circuit illustrated in FIG. 4A is shown generally at 104 in dashed lines. The reference portion 104 is connected to the reference electrode 100 and is a substantially identical to the test current injection and voltage measuring circuit of the pH electrode 10. To identify like components, numeric designations have been repeated with circuit elements of the reference portion 104 including an additional "R" designation. It should be noted that since the resistance of the reference electrode 100 is considerably less than the resistance of the pH electrode 10, the value of the resistor 18R is less than the value of resistor 18 to allow greater test currents to be injected.

The timing logic circuit 56 and the switches 44A, 44B, 46A and 46B from FIG. 1 have been replaced by the oscillator and demodulator circuit 106. As stated above, the circuit 106 provides test currents to be injected into the pH electrode 10 and the reference electrode 100, while receiving corresponding voltages developed at terminals 26 and 26R. The voltages from terminals 26 and 26R are used to provide signals at output terminals 106A, 106B, 106C and 106D corresponding to the source voltage of the pH electrode, the source resistance of the pH electrode, the source voltage of the reference electrode, and the source resistance of the reference electrode, respectively. Each of the afore-mentioned signals are provided to suitable voltage followers 108 and 108R, which in turn provide input signals to the output circuit 103 on signal lines 105A, 105B, 105C and 105D.

The output circuit 103 includes a multiplexer 110, an analog-to-digital ("A/D") converter 112 and central processing unit ("CPU") 114 such as a microprocessor. The multiplexer 110 receives command signals from the CPU 114 to selectively transmit the signals from the input terminals 105A–105D to the A/D converter 112. Digitized data from the A/D converter 112 is provided back to the CPU 114 on a data transmission line 107. Using the digitized data, the CPU 114 provides suitable visual indications of the measured source voltage and source resistance parameters of the pH electrode 10 and reference electrode 100 with a display 116. A conventional 4–20 milliamp output circuit 115 can be included to provide a current signal proportional to each of the measured quantities. Interaction with the system 99 is provided through a suitable interface such as a keyboard 118.

In addition, since the resistivity of the pH electrode 10 varies with temperature in accordance with well known principles, the system 99 includes a suitable probe 120 to measure the temperature of the monitored solution. Illustrated as a three-wire resistive temperature device, the probe 120 includes conventional "source", "return" and "sense" signal lines, generally indicated at 117, which together provide a signal proportional to the temperature of the solution. Through the A/D converter 112 and the multiplexer 110, the CPU 114 receives digitized data corresponding to the solution temperature and adjusts the measured quantities in accordance with well known factors.

Also illustrated in FIG. 4A is a solution ground probe 11. The solution ground probe 11 allows the user to monitor both the pH electrode 10 and the reference electrode 100 independently for coating or cracking as opposed to only monitoring the entire system if a solution ground probe was not used.

Figure 5A:
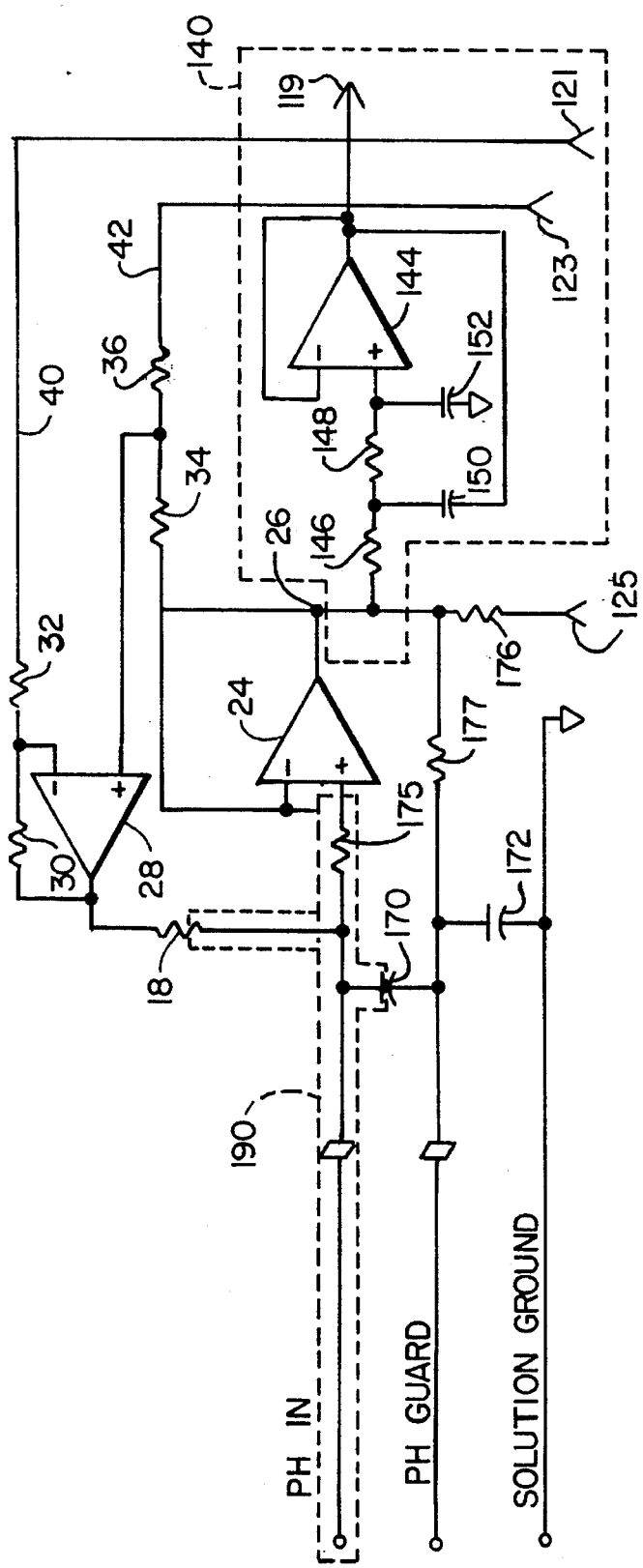
Figure 5A:
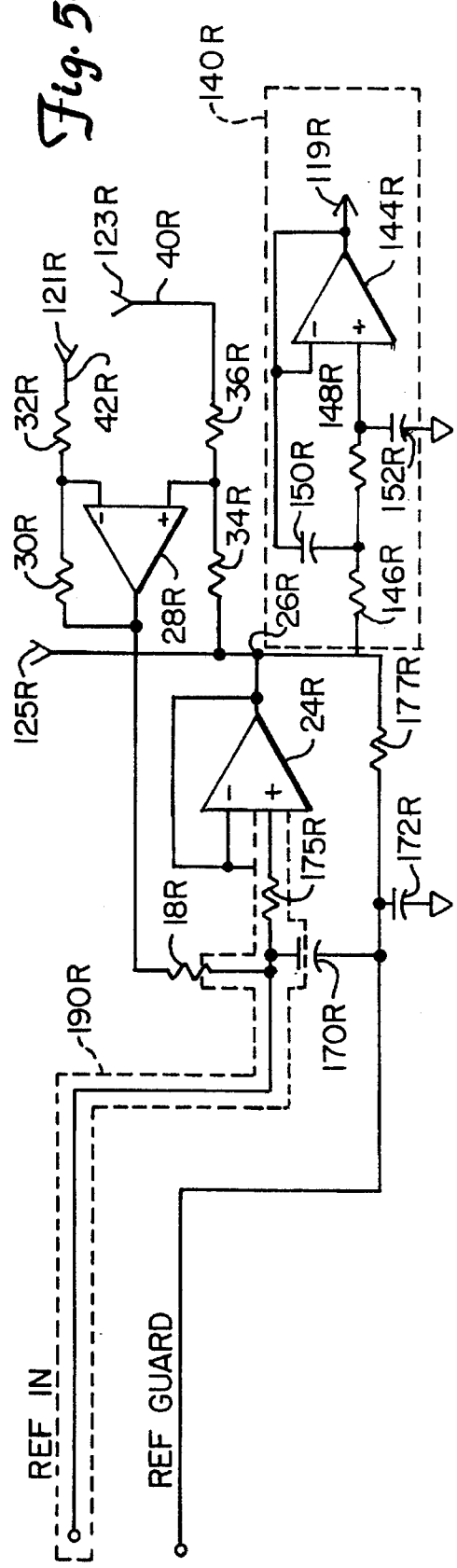
Figure 5B:
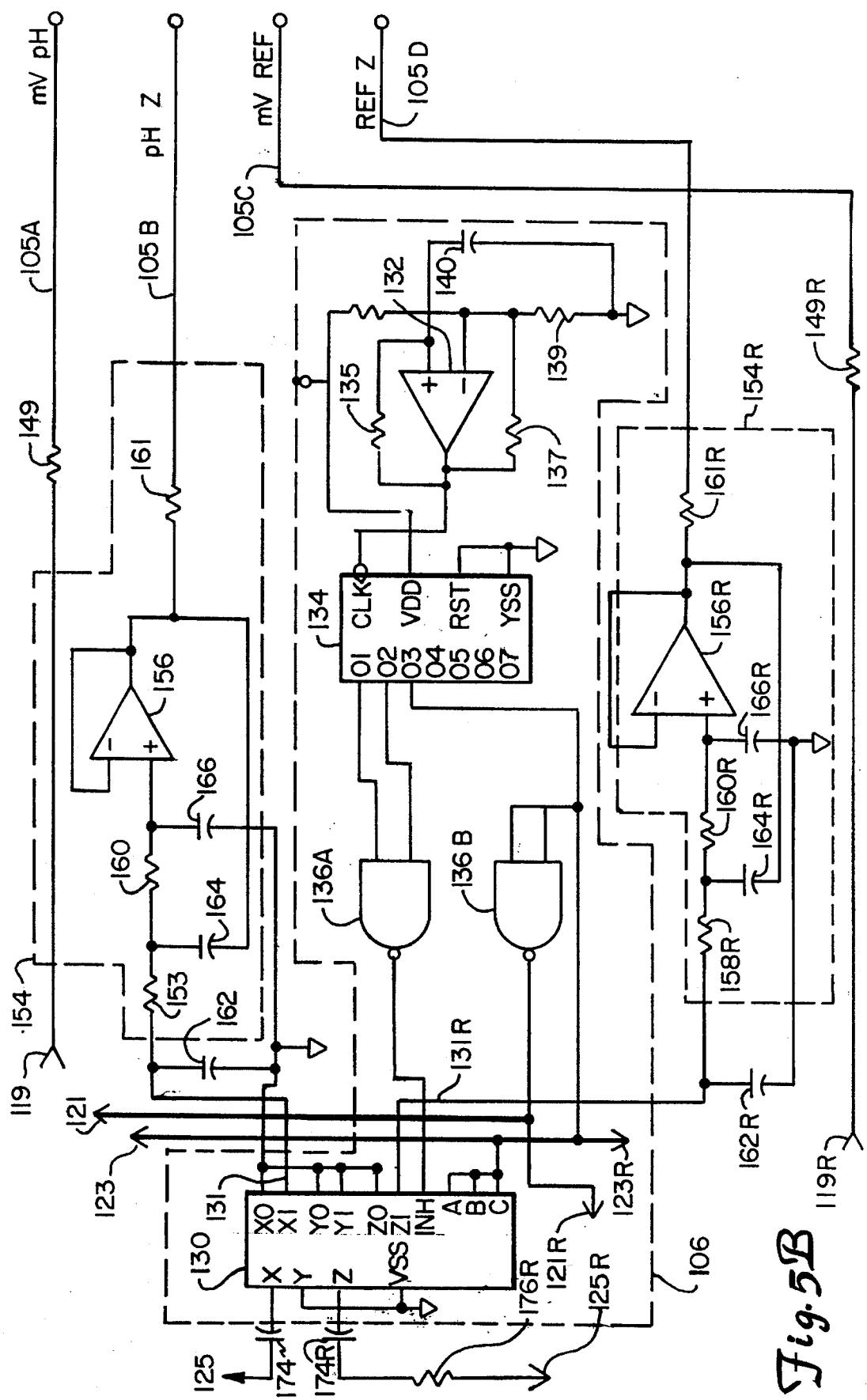

FIGS. 5A and 5B illustrate a more detailed diagram of the test current injection and voltage measuring circuit 101 of FIGS. 4A and 4B. FIGS. 5A and 5B are connected for illustrative purposes via terminal connections 119, 119R, 121, 121R, 123, 123R, 125 and 125R. As with the diagram illustrated in FIGS. 4A and 4B, the same numeric designators have been used in the pH electrode monitoring circuit portion and the resistance electrode circuit portion to identify like components or circuit portions. Although described with reference primarily to the pH electrode monitoring circuit portion, it is to be understood similar functions are performed by the reference electrode monitoring portions.

Referring to FIG. 5B, the oscillator and demodulator circuit 106 of FIG. 4A has been broken down to separate components and is shown together in dashed lines. An analog multiplexer/demultiplexer 130, a counter 134 and a nand gate 136A are provided to handle the demodulating tasks. A voltage comparator 132 configured with resistors 133, 135, 137, 139, and capacitor 140 creates a relaxation oscillator corresponding to the oscillator 58 of FIG. 1.

The binary counter 134 receives the output of the comparator 132 and functions as the timing logic portion 56 of FIG. 1. Selected outputs of the binary counter 134 are connected to the nand gate 136A and a nand 136B. The output of the nand gate 136B (provided to the circuit portion illustrated in FIG. 5A through terminal connections 121 and 121R) in combination with the input signal received from the binary counter 134 (provided to the circuit portion illustrated in FIG. 5a through terminal connections 123 and 123R) provide reference voltages on signal lines 40, 42, 40R and 42R to generate the positive and negative test currents, as described above. Like the embodiment illustrated in FIG. 1, voltage signals are obtained at the output terminals 26 and 26R and are a function of the injected test currents.

In the embodiment illustrated in FIGS. 5A and 5B, there is no longer a summing circuit or a difference circuit as embodied in FIG. 2 to calculate the source voltage and the source resistance, respectively. To calculate the source voltage, for example, the source voltage of the pH electrode, the voltage signal present at output terminal 26 is obtained by applying the signal to a two pole filter 140, which filters out the ac component and provides a substantially dc signal at terminal connection 119 proportional to the value of the source voltage. The two pole filter 140 comprises an amplifier 144, resistors 146, 148, and 149, and capacitors 150 and 152.

The difference between the peak to peak voltage at terminal 26, which 16 directly proportional to the source resistance of the electrode, is found by applying the signal at terminal 26 selectively across a capacitor 174 and the series combination of the capacitor 174 and a capacitor 162. In operation, as with the embodiment of FIG. 2 as illustrated in FIG. 3, the peak to peak voltage levels are selectively sampled when the voltage levels are substantially stable. In the embodiment of FIGS. 5A and 5B, the control signals [or sampling are provided from the output of the nand gate 136A. With respect to FIG. 3, the control signal from the nand gate 136A is the additive combination of the signals 69 and 71.

Referring also to FIG. 3, the signal representing the difference between the voltages $e_{o+}$ and $e_{o-}$ provided from an output terminal 131 of the multiplexer/demultiplexer 130 is applied to a two pole filter 154. Specifically, during the time period $T_2$ to $T_3$, the voltage $e_{o-}$ is stored across the capacitor 174 when the voltage $e_{o-}$ is substantially stable and the control pulse (corresponding to signal 71) is received from the nand gate 136A. During the time period $T_3$ to $T_4$, the positive test current is injected into the electrode in the manner described above to raise the voltage at the terminal 26 to the level of $e_{o+}$. When the voltage is substantially stable and the control pulse (corresponding to signal 69) is received, the multiplexer/demultiplexer 130 connects the capacitor 174 in series with the capacitor 162, thereby providing the difference in voltage to the two pole filter 154 and across capacitor 162. As illustrated, the filter 154 comprises an amplifier 156, resistors 158, 160 and 161, and capacitors 164 and 166.

Filter capacitors 170, 172, and 174 are found in FIGS. 5A and 5B. These capacitors are standard capacitors and are well known in the art. Also conventionally used are limiting resistors 176 and 177.

As described above and illustrated in FIG. 4A, the coaxial cable 22 is boot-strapped to reduce the effective input capacitance and to improve the speed of the monitoring system. In addition, it should be noted that if embodied on a conventional circuit board, signal traces used to shield the signal lines connecting the coaxial cables 22 and 22R to amplifier 24 should also be boot-strapped or driven with the output voltage from the terminals 26 and 26R, respectively. The shield traces are illustrated in FIG. 5A schematically by dashed lines 190 and 190R.

Although the present invention has been described with reference to preferred embodiments, workers skilled in the art will recognize that changes may be made in form and detail without departing from the spirit and scope of the invention.

What is claimed is:

1. A method for measuring a resistance of a sensor, the method comprising the steps of:
   injecting a first test current into the sensor;
   measuring a substantially stable first voltage level across the sensor when the first test current is present;
   injecting a second test current into the sensor, the second test current being substantially equal to but opposite in polarity to the first test current;
   measuring a substantially stable second voltage level across the sensor when the second test current is present;
   calculating the resistance of the sensor as a function of the measured first voltage level and the measured second voltage level.

2. The method of claim 1 and further comprising the step of calculating a source voltage of the sensor as a function of the measured first voltage level and the measured second voltage level.

3. The method of claim 2 wherein the step of calculating the source voltage comprises averaging the measured first voltage level and the measured second voltage level.

4. The method of claim 2 wherein the step of calculating the source voltage comprises filtering the source voltage from the measured first voltage level and the measured second voltage level.

5. The method of claim 1 wherein the steps of injecting comprise generating the first and second test currents with a differential circuit having a first input and a second input for receiving selected reference control signals.

6. The method of claim 5 wherein the selected reference control signals are provided by oscillation means.

7. The method of claim 1 wherein the step of calculating comprises obtaining the difference between the first measured voltage level and the second measured voltage level.

8. The method of claim 7 wherein the difference between the first measured voltage level and the second measured voltage level is obtained by a differential circuit.

9. The method of claim 7 wherein the difference between the first measured voltage level and the second measured voltage level is obtained by a demodulating circuit.

10. An apparatus for measuring a resistance of a monitoring system comprising a sensor, the apparatus comprising:
    means for injecting a first test current and a second test current into the sensor, the second test current being substantially equal to but opposite in polarity to the first test current;
    means for measuring a substantially stable first and second voltage level across the sensor when the corresponding first test current and second test current are present; and
    means for calculating the resistance of the sensor as a function of the measured first voltage level and the measured second voltage level.

11. The apparatus of claim 10 and further comprising means for calculating a source voltage of the sensor as a function of the measured first voltage level and the measured second voltage level.

12. The apparatus of claim 11 wherein the means for calculating the source voltage comprises an averaging circuit for averaging the measured first voltage level and the second voltage level.

13. The apparatus of claim 11 wherein the means for calculating the source voltage comprises a filtering circuit for filtering the source voltage from the measured first voltage level and the second voltage level.

14. The apparatus of claim 10 wherein the means for injecting comprise generating the first and second test currents with a differential circuit having a first input and a second input for receiving selected reference control signals.

15. The apparatus of claim 14 wherein the selected reference control signals are provided by oscillation means.

16. The apparatus of claim 10 wherein the means for calculating comprises difference means for obtaining the difference between the first measured voltage level and the second measured voltage level.

17. The apparatus of claim 16 wherein the difference means comprises a differential circuit.

18. The apparatus of claim 16 wherein the difference means comprises a demodulating circuit.

19. The apparatus of claim 10 wherein the monitoring system comprises a second sensor, the apparatus further measuring a resistance of the second sensor
    wherein the means for injecting further injects a third test current and a fourth test current into the second sensor, the fourth test current being substantially equal to but opposite in polarity to the third test current;
    wherein the means for measuring further measures a substantially stable third and fourth voltage level across the second sensor when the corresponding third test current and fourth test current are present; and
    wherein the means for calculating further calculates the resistance of the second sensor as a function of the measured third voltage level and the measured fourth voltage level.

20. The apparatus of claim 19 wherein the monitoring system comprises a selective ion monitoring system for monitoring a test solution and the first mentioned sensor comprises a selective ion electrode and the second sensor comprises a reference electrode.

21. The apparatus of claim 20 wherein the reference electrode comprises a second selective ion electrode.

22. The apparatus of claim 20 wherein the first mentioned sensor is a pH electrode.

23. The apparatus of claim 20 wherein the reference electrode is a pH electrode immersed in a reservoir filled with a pH buffer solution having a porous junction in contact with the test solution.

24. The apparatus of claim 20 and further comprising a ground probe forming a common ground path for the selective ion electrode and the reference electrode.

* * * * *

UNITED STATES PATENT AND TRADEMARK OFFICE
CERTIFICATE OF CORRECTION

PATENT NO.   : 5,469,070
DATED        : November 21, 1995
INVENTOR(S)  : Roland H. Koluvek It is certified that error appears in the above-indentified patent and that said Letters Patent is hereby corrected as shown below:

TITLE PAGE:

Under [56] References Cited, U.S. PATENT DOCUMENTS, please replace:

"3,661,748  5/1971  Blackmer" with
--3,661,748  5/1972  Blackmer--.

Under FOREIGN PATENT DOCUMENTS please insert
--DE-- before "3239572A1".

Signed and Sealed this

Third Day of September, 1996

Attest:

BRUCE LEHMAN

*Attesting Officer*            *Commissioner of Patents and Trademarks*

UNITED STATES PATENT AND TRADEMARK OFFICE
CERTIFICATE OF CORRECTION

PATENT NO. : 5,469,070
DATED : November 21, 1995
INVENTOR(S) : Roland H. Koluvek It is certified that error appears in the above-indentified patent and that said Letters Patent is hereby corrected as shown below:

```
Column 4, line 24, replace "44S" with --44B--.

Column 4, line 26, replace "67" with --57--.

Column 4, line 31, replace "62" with --52--.

Column 6, line 39, replace "43" with --42--.

Column 7, line 46, replace "resistance" with
--reference--.

Column 8, line 26, replace "[or" with --for--.
```

Signed and Sealed this

Twenty-seventh Day of January, 1998

Attest:

BRUCE LEHMAN

*Attesting Officer*     *Commissioner of Patents and Trademarks*